(12) United States Patent
Li et al.

(10) Patent No.: US 6,559,484 B1
(45) Date of Patent: May 6, 2003

(54) EMBEDDED ENCLOSURE FOR EFFECTIVE ELECTROMAGNETIC RADIATION REDUCTION

(75) Inventors: Yuan-Liang Li, Chandler, AZ (US); Chee-Yee Chung, Chandler, AZ (US); David G. Figueroa, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 257 days.

(21) Appl. No.: 09/672,619

(22) Filed: Sep. 29, 2000

(51) Int. Cl.⁷ .............................................. H01L 27/10
(52) U.S. Cl. ................... 257/207; 257/208; 257/211; 257/659; 257/691; 257/700; 257/758; 257/774
(58) Field of Search ................................ 257/207, 208, 257/659, 678, 700, 701, 734, 758, 759, 773, 774, 778, 779, 780, 210, 211; 438/108, 618, 622; 361/748, 751, 777, 783; 174/256, 255, 261, 264

(56) References Cited

U.S. PATENT DOCUMENTS

| | | | | |
|---|---|---|---|---|
| 5,741,729 A | * | 4/1998 | Selna | 438/125 |
| 5,847,936 A | * | 12/1998 | Forehand et al. | 361/794 |
| 6,084,779 A | * | 7/2000 | Fang | 361/763 |
| 6,181,004 B1 | * | 1/2001 | Koontz et al. | 257/691 |
| 6,191,472 B1 | * | 2/2001 | Mazumder | 257/691 |
| 6,352,914 B2 | * | 3/2002 | Ball et al. | 438/599 |
| 6,388,207 B1 | * | 5/2002 | Figueroa et al. | 174/262 |

* cited by examiner

Primary Examiner—David L. Talbott
Assistant Examiner—Alonzo Chambliss
(74) Attorney, Agent, or Firm—Blakely, Sokoloff, Taylor & Zafman LLP

(57) ABSTRACT

In one embodiment of the invention, an embedded enclosure includes a power plane and first and second ground planes. The power plane has a power surface and a power periphery, and couples power to signals of an integrated circuit operating at a fundamental frequency. The first and second ground planes have first and second ground surfaces and first and second ground peripheries, respectively. The first and second ground planes couple ground to the signals. The first and second ground planes are separated from the power plane by first and second distances, respectively. The first and second ground surfaces are larger than the power surface. The first and second ground peripheries extend at least third and fourth distances from the power periphery, respectively. The third and fourth distances are N and M times larger than the first and second distances, respectively.

30 Claims, 8 Drawing Sheets

EMBEDDED ENCLOSURE FOR EFFECTIVE ELECTROMAGNETIC RADIATION REDUCTION

BACKROUND

1. Field of the Invention

This invention relates to packaging. In particular, the invention relates to component packaging.

2. Description of Related Art

High performance integrated circuits are becoming more integrated, smaller and faster. As clock frequencies increase, radiation from packages and interposers becomes a serious electromagnetic interference (EMI) or electromagnetic compatibility (EMC) problem. In addition, as the footprint of integrated devices becomes smaller, discrete capacitors are not effectively attached close to the device because the size of discrete capacitors tend to be large. Even when capacitors are made integral to the device, large amount of instantaneously charged or discharged currents may cause undesirable EMI radiation.

Techniques to reduce EMI radiation have disadvantages. One technique uses metal enclosure to cover the entire device or the assembly including the motherboard. This technique is expensive and ineffective.

Therefore, there is a need to have an efficient technique to package integrated circuits to reduce electromagnetic radiation.

BRIEF DESCRIPTION OF THE DRAWINGS

The features and advantages of the present invention will become apparent from the following detailed description of the present invention in which.

DESCRIPTION

In one embodiment of the invention, an embedded enclosure includes a power plane and first and second ground planes. The power plane has a power surface and a power periphery, and couples power to signals of an integrated circuit operating at a fundamental frequency. The first and second ground planes have first and second ground surfaces and first and second ground peripheries, respectively. The first and second ground planes couple ground to the signals. The first and second ground planes are separated from the power plane by first and second distances, respectively. The first and second ground surfaces are larger than the power surface. The first and second ground peripheries extend at least third and fourth distances from the power periphery, respectively. The third and fourth distances are N and M times larger than the first and second distances, respectively.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
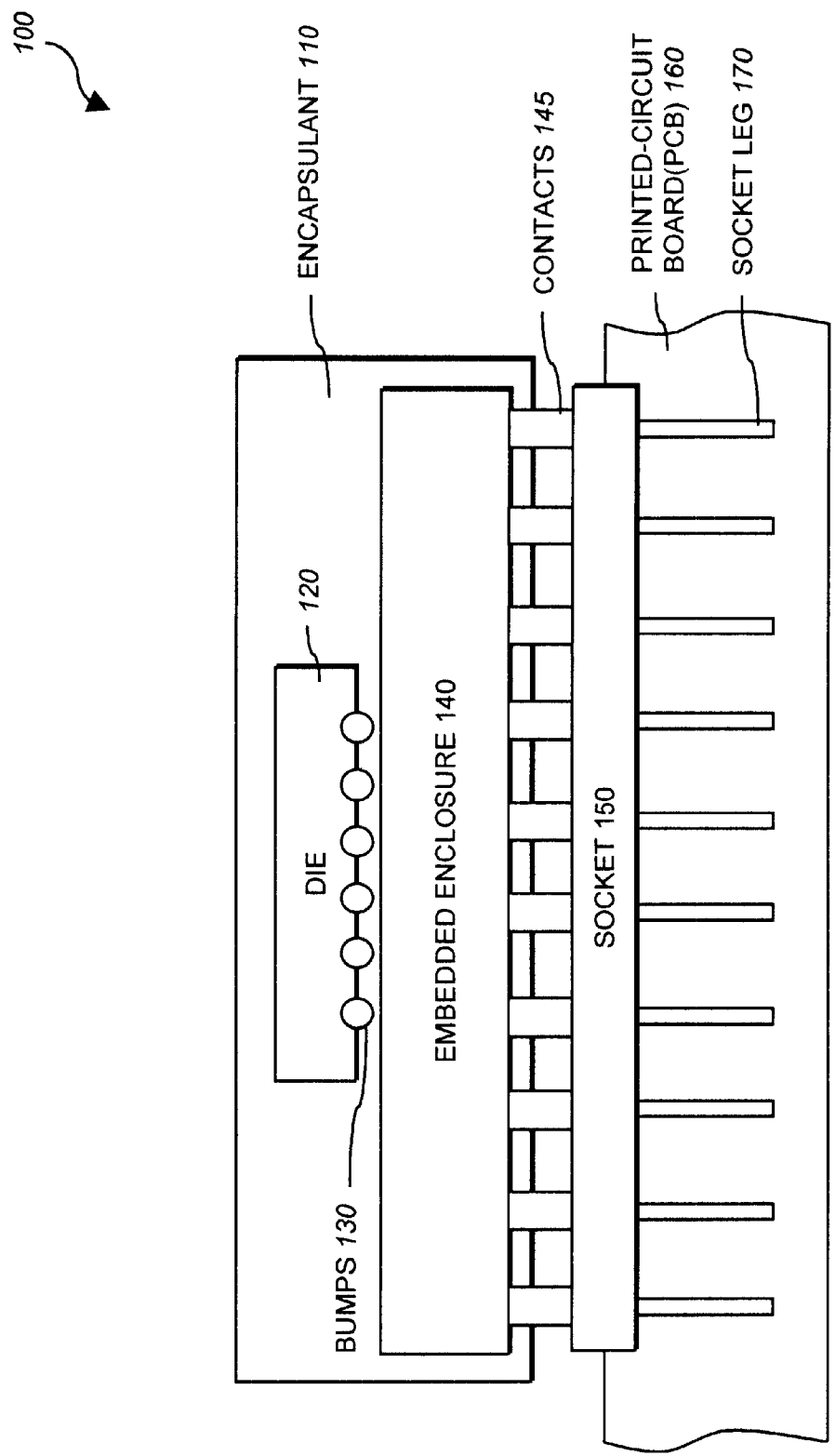
FIG. 1 is a diagram illustrating a packaged device in which one embodiment of the invention can be practiced.

FIG. 1 is a diagram illustrating a packaged device 100 in which one embodiment of the invention can be practiced. The packaged device 100 includes an encapsulant 110, a die 120, an embedded enclosure 140, a plurality of contacts 145, a socket 150, and a printed circuit board (PCB) 160.

The encapsulant 110 encapsulated the die 120 and the embedded enclosure 140. The encapsulant 110 may be made by plastic or any appropriate material. The die 120 contains an integrated circuit having electronic circuits and signal traces connecting elements of the electronic circuits. The integrated circuit may be any type of integrated circuit such as a microprocessor, an application specific integrated circuit (ASIC), a programmable logic device (PLD), a digital signal processor (DSP), a gate array, a memory device, a logic device, etc. The die 120 has a plurality of controlled collapse chip connection (C4) solder balls, or C4 bumps, 130. The C4 bumps 130 are attached to a plurality of metal conductive pads or C4 bump pads (not shown) on the top surface of the embedded enclosure 140.

The embedded enclosure 140 provides electromagnetic interference (EMI) shielding for the integrated circuit in the die 120 when operating. The embedded enclosure 140 is part of the packaged device 100 and can use existing ground planes, vias, contacts (e.g., C4 bumps, ball grid array balls, and pins) without extra cost. The embedded enclosure 140 helps meeting regulations and requirements mandated by government agencies or private standards organizations.

The plurality of contacts 145 provide contacts to the socket 150. The contacts 145 may be pins for a pin grid array (PGA) or solder balls. The socket 150 provides placement of the encapsulant 110 onto the PCB 160. The socket 150 have a number of socket legs 170 to make contact with the signal, ground, and power traces/planes on the PCB 160. The PCB 160 is an assembly having other circuits or packaged devices connected together.

Figure 2A:
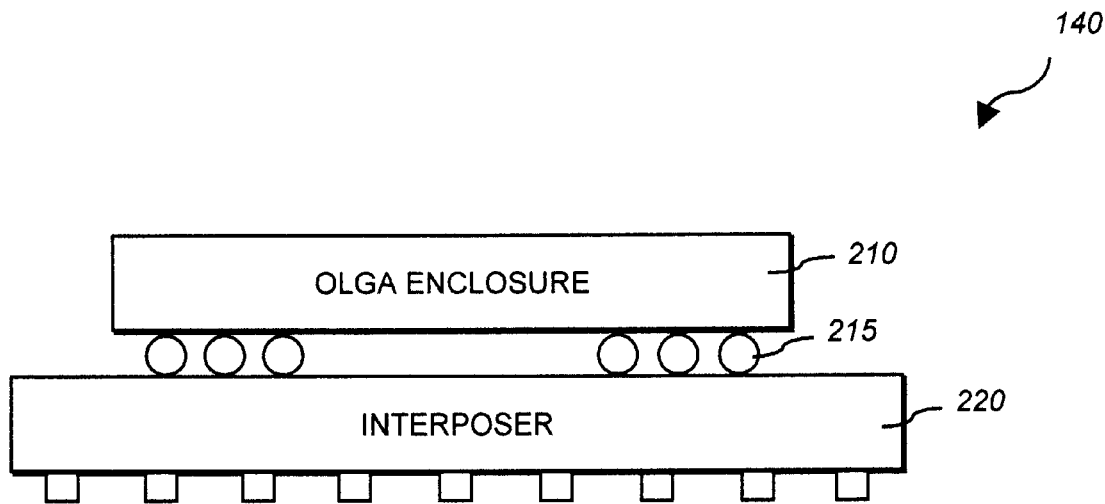
FIG. 2A is a diagram illustrating an embedded enclosure for organic land grid array according to one embodiment of the invention.

FIG. 2A is a diagram illustrating an embedded enclosure 140 for organic land grid array (OLGA)package according to one embodiment of the invention. The enclosure 140 includes an OLGApackage enclosure 210 and an interposer 220.

The OLGApackage enclosure 210 is used for OLGA packaging model. The OLGApackage enclosure 210 has a plurality of solder balls 215. The solder balls 215 may be the C4 bumps which are attached to the top surface of the interposer 220. The interposer 220 provides mounting pins to allow insertion of the packaged device 100 into a pin grid array socket on the PCB.

Figure 2B:
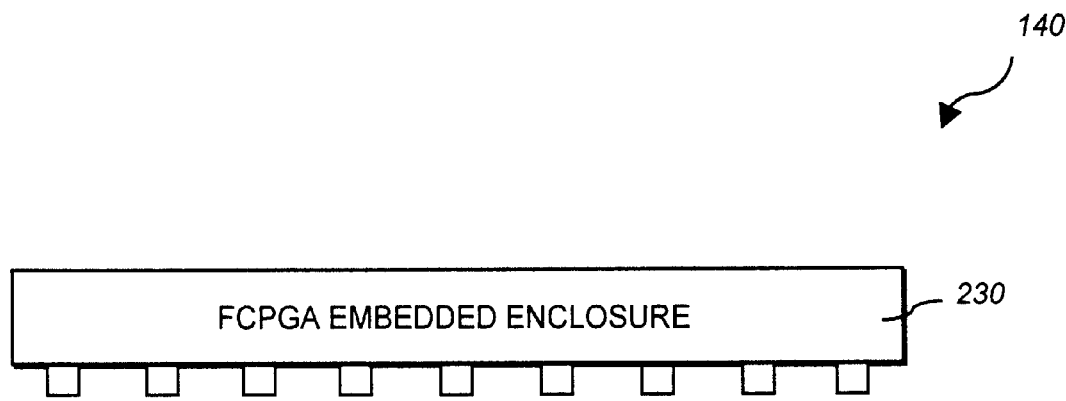
FIG. 2B is a diagram illustrating an embedded enclosure for flip chip pin grid array according to one embodiment of the invention.

FIG. 2B is a diagram illustrating an embedded enclosure 140 for flip chip pin grid array (FCPGA)package according to one embodiment of the invention. The enclosure 140 has a contact array which consists of pins for the FCPGA and can be used directly to mount on a socket.

Figure 3A:
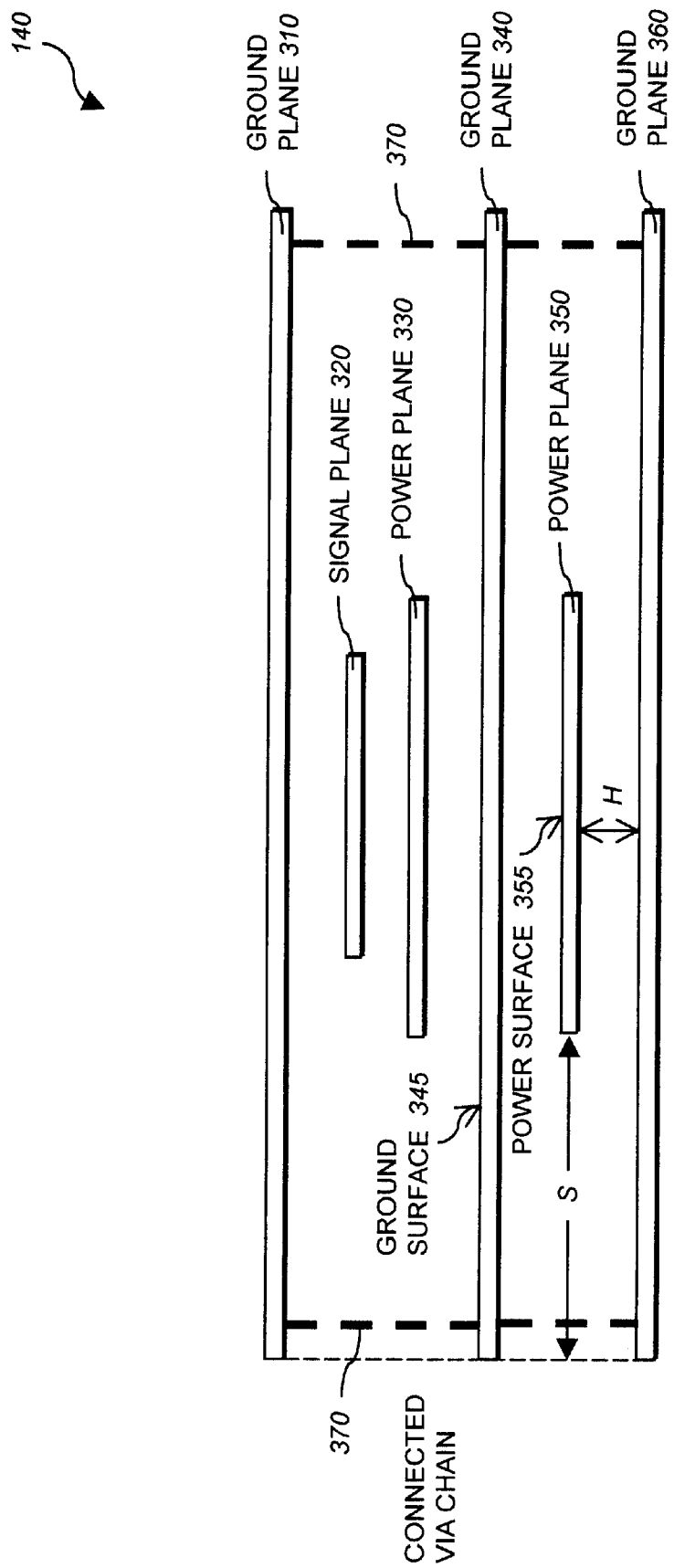
FIG. 3A is a diagram illustrating a cross section view for the embedded enclosure according to one embodiment of the invention.

FIG. 3A is a diagram illustrating a cross sectional view for the embedded enclosure 140 according to one embodiment of the invention. The enclosure 140 includes ground planes 310, 340, and 360, a signal plane 320, and power planes 330 and 350. The use of three ground planes and two power planes is for illustrative purposes only. Any number of ground and power planes can be used.

The ground planes 310, 340, and 360 are approximately of the same size, which is comparable to the size of the die 120 (FIG. 1). The ground planes 310, 340, and 360 are connected by a connected via chain 370.

The signal plane 320 provides signal traces to the integrated circuit in the die 120 (FIG. 1) and is located between the power plane 330 and the ground plane 310. The signals of the integrated circuit may operate at a fundamental frequency. For EMI and EMC considerations, typically the highest frequency of interest is approximately ten times the fundamental frequency. For example, this fundamental frequency may be the core frequency of the microprocessor. The power plane 330 provides power coupling to the signals of the integrated circuit in the die 120. The power plane 330 has a power surface and a power periphery. Similarly, the ground planes 310, 340 and 360 have respective groundpower surfaces and groundpower peripheries and provide ground coupling for the integrated circuit of the die 120. To provide proper EMI and/or EMC reduction, the size and distance of the power planes 330 and 350, and the ground planes 310, 340, and 360 preferably follow a distinct relationship.

Suppose the distance between a ground plane and a power plane is H. The ground surface of the ground plane is larger than the power surface of the power plane. For example, the ground surface 345 of the ground plane 340 is larger the power surface 355 of the power plane 350. The minimum distance between a ground periphery and a power periphery is S. In other words, from the top down, the power plane is covered by the ground plane and the distances between the edges of the power plane to the edges of the ground plane are equal to or larger than S.

In one embodiment, the distance relationship between S and H is S>20H. This is known as the 20-H rule. This concept is premised on the fact that radio frequency (RF) currents exit on the outer edges of power planes due to magnetic flux leakage. The radio frequency currents cause fringing of current between power and ground planes, thereby radiating RF energy into free space. To minimize the fringing effect, the ground plane is larger than the power plane (e.g., 20-H). In alternative embodiments, S may be less than 20 times H, and may be 10H, 5H, or even 1H.

Figure 3B:
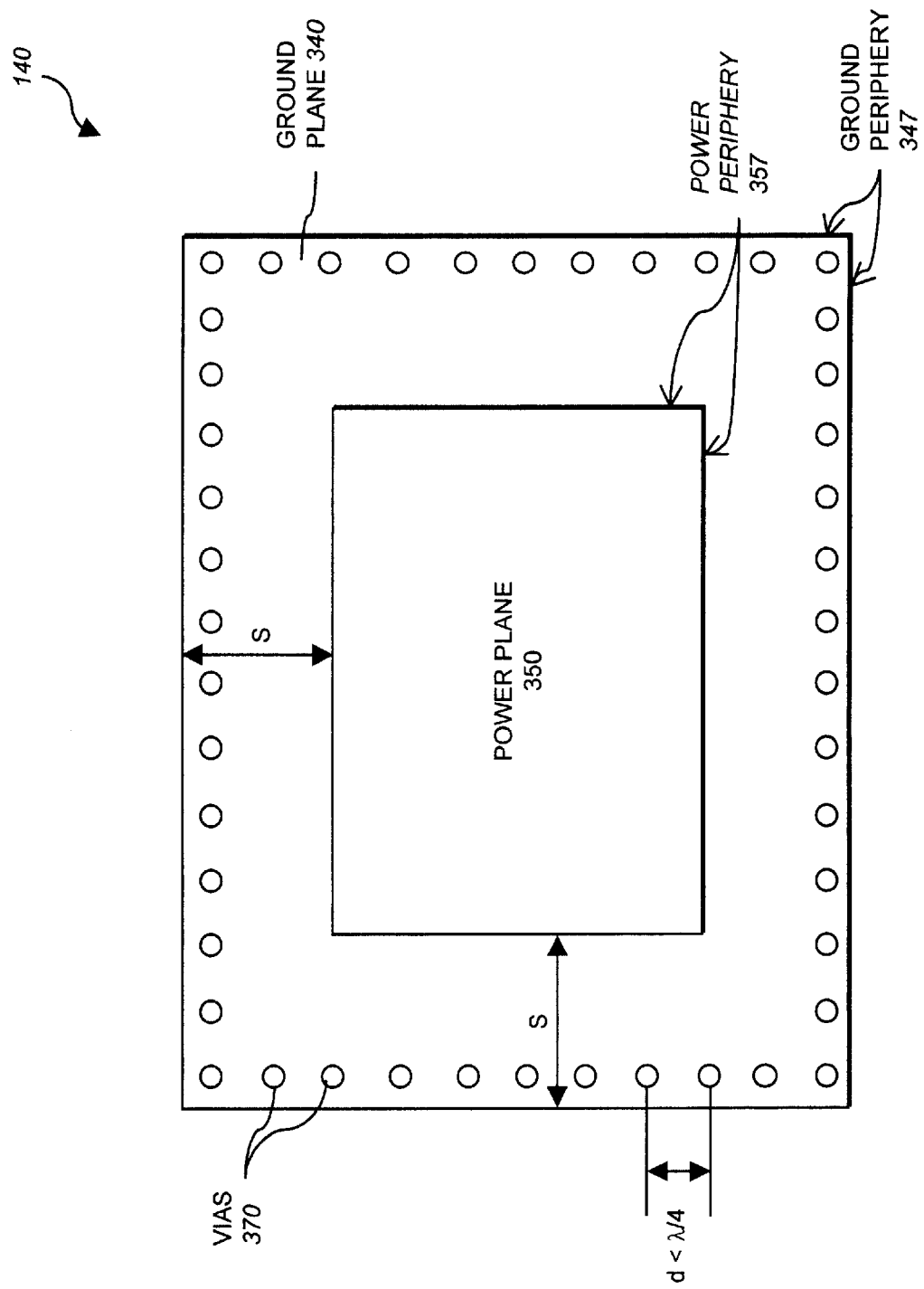
FIG. 3B is a diagram illustrating a top view for the embedded enclosure according to one embodiment of the invention.

FIG. 3B is a diagram illustrating a top view for the embedded enclosure according to one embodiment of the invention. The top view shows the ground plane 340 is above the power plane 350.

The ground and power planes 340 and 350 have peripheries 347 and 357, respectively. The distance between the power periphery 357 and ground periphery 347 is at least S. In other words, the distance between the power periphery 357 and ground periphery 347 does not have to be uniformly equal to S, but could be equal to or larger than S. Furthermore, although the periphery is shown to be rectangular, any shape or form can be used, e.g., square, circular, triangular, or even irregular, as long as the distance relationship is maintained.

The ground plane 340 has the connected via chain 370 which includes a number of vias located around the first ground periphery 347 and outside the power periphery 357. The vias having adjacent vias which are spaced apart by a via distance d. In one embodiment, the via distance d is smaller than a quarter wavelength of the highest frequency of interest. The distance between adjacent vias from one via to another may be different, but the maximum separation between adjacent vias should be less than a quarter wavelength of the highest frequency of interest.

Ideally, sinusoidal signals are perfect in that they only contain energy at one frequency, and no harmonic energy, i.e., energy at multiples of the fundamental frequency. However, in reality, signals are not perfectly sinusoidal, and contain some energy at harmonic frequencies. For integrated circuits, the amount of energy radiated at different harmonic frequencies is typically measured to determine which harmonic frequencies, if any, have the highest amount of energy radiated. The fundamental frequency is then multiplied by the value N, where the N-th harmonic has the highest amount of energy radiated. For example, if the 10-th harmonic radiates the highest amount of energy, the fundamental frequency is multiplied by 10. This value is then converted to wavelength, using the following equation:

$$c = \lambda * f \quad (1)$$

where c is the speed of light, $\lambda$ is the wavelength, and f is the fundamental frequency. The spacing d between adjacent vias is then less than $\lambda/4$, according to the following equation:

$$d < \lambda/4 = c/(4*N*f) \quad (2)$$

For example, if N=10, f=1 GHz, c=3×10$^8$ m/s, then:

$$d < 3 \times 10^8 \text{ m/s}/(4*10* 1 \times 10^9 \text{ cycles/s}) = 0.75 \text{ cm} \quad (3)$$

Figure 4:
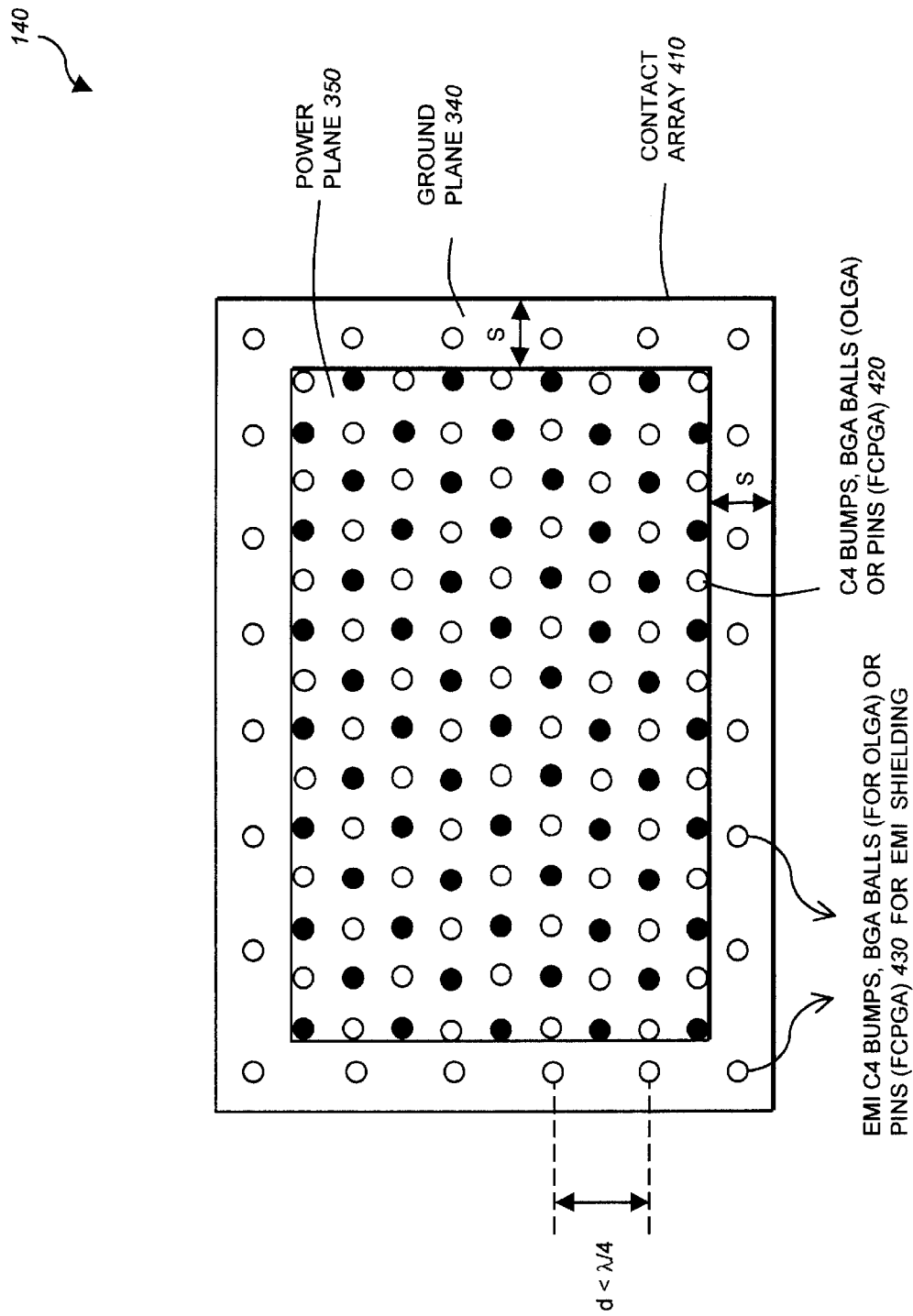
FIG. 4 is a diagram illustrating a top view for the embedded enclosure with EMI contacts according to one embodiment of the invention.

FIG. 4 is a diagram illustrating a top view for the embedded enclosure 140 with EMI contacts according to one embodiment of the invention. The embedded enclosure 140 has the ground plane 340, the power plane 350, and a contact array 410.

The contact array 410 includes a number of contacts 420 made by appropriate contact type depending on the packaging type. For example, the contact array 410 may include an array of C4 bumps, BGA balls (for OLGA packaging), or pins (for FCPGA packaging). These contacts 420 may be connected to the power plane 350 and/or the ground plane 340. As shown in FIG. 4, the contacts 420 are shown at random as filled black to indicate that they are connected to the power plane 350 and unfilled white to indicate that they are connected to the ground plane 340. The periphery of the contact array 410 is approximately the same as the periphery of the power plane 350.

The ground plane 340 has a plurality of adjacent contacts 420 to provide EMI shielding. The EMI adjacent contacts 420 are spaced apart by a contact distance d that is smaller than a quarter wavelength of the fundamental frequency The calculations are the same as given by equations (1) through (3) above. The adjacent contacts 420 are the same type with the contacts 420 in the contact array 410. In other words, the adjacent contacts 420 may be controlled collapse chip connection (C4) bumps, ball grid array (BGA) balls, or flip chip pin grid array (FCPGA) pins.

Figure 5:
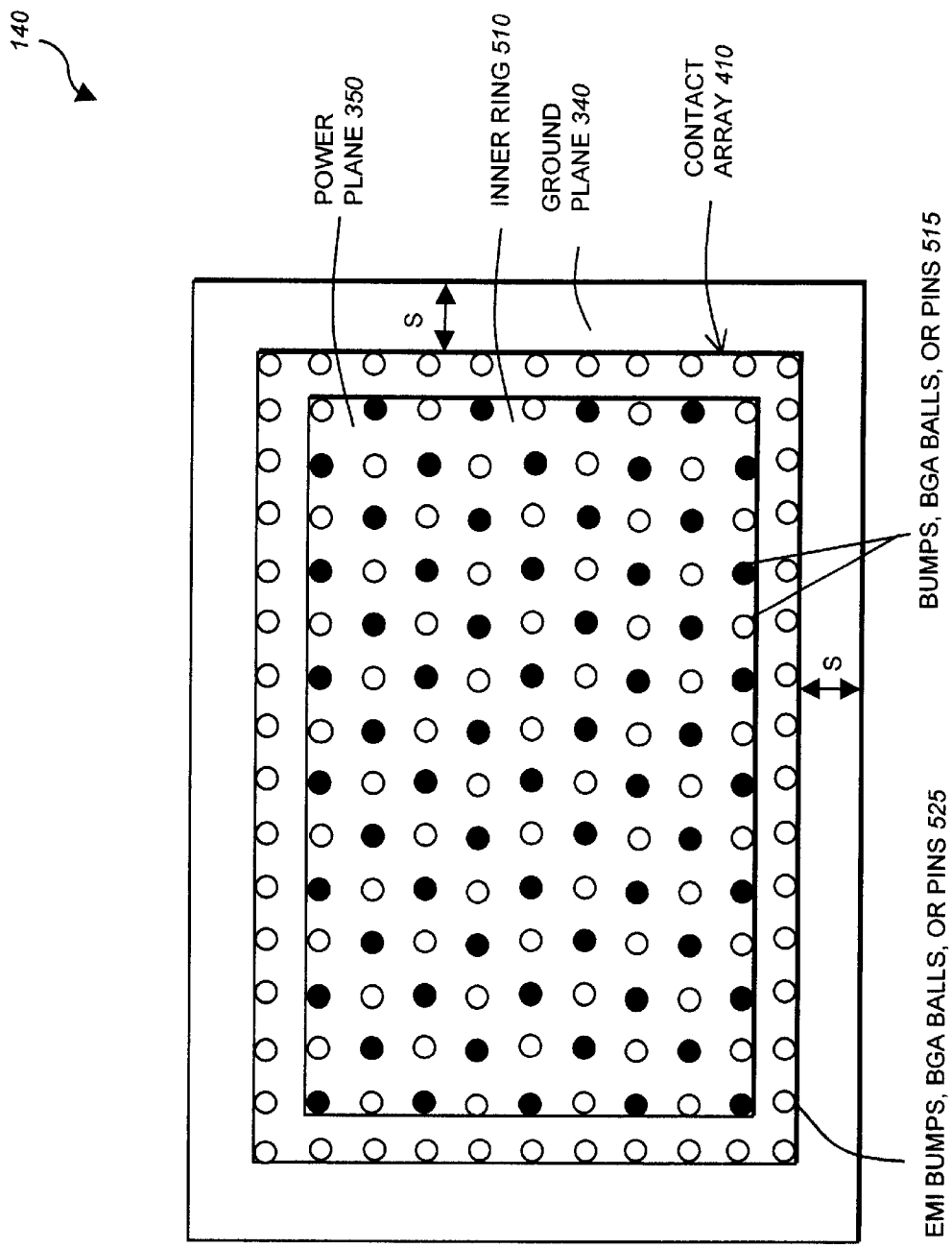
FIG. 5 is a diagram illustrating a top view for the embedded enclosure with EMI outer ring according to one embodiment of the invention.

FIG. 5 is a diagram illustrating a top view for the embedded enclosure 140 with EMI outer ring according to one embodiment of the invention.

In this embodiment, there are no adjacent contacts outside the periphery of the power plane 350. Instead, the contact array 410 includes an inner ring 510 and an outer ring 520. The inner ring 510 includes contacts 515 that are connected to at least the ground plane 340 and the power plane 350. The outer ring 520 provides EMI shielding and includes contacts 525 of the same type that are attached to the ground plane 340. The contacts 515 and 525 may be C4 bumps, BGA balls (for OLGA packaging), or pins (for FCPGA packaging).

Figure 6:
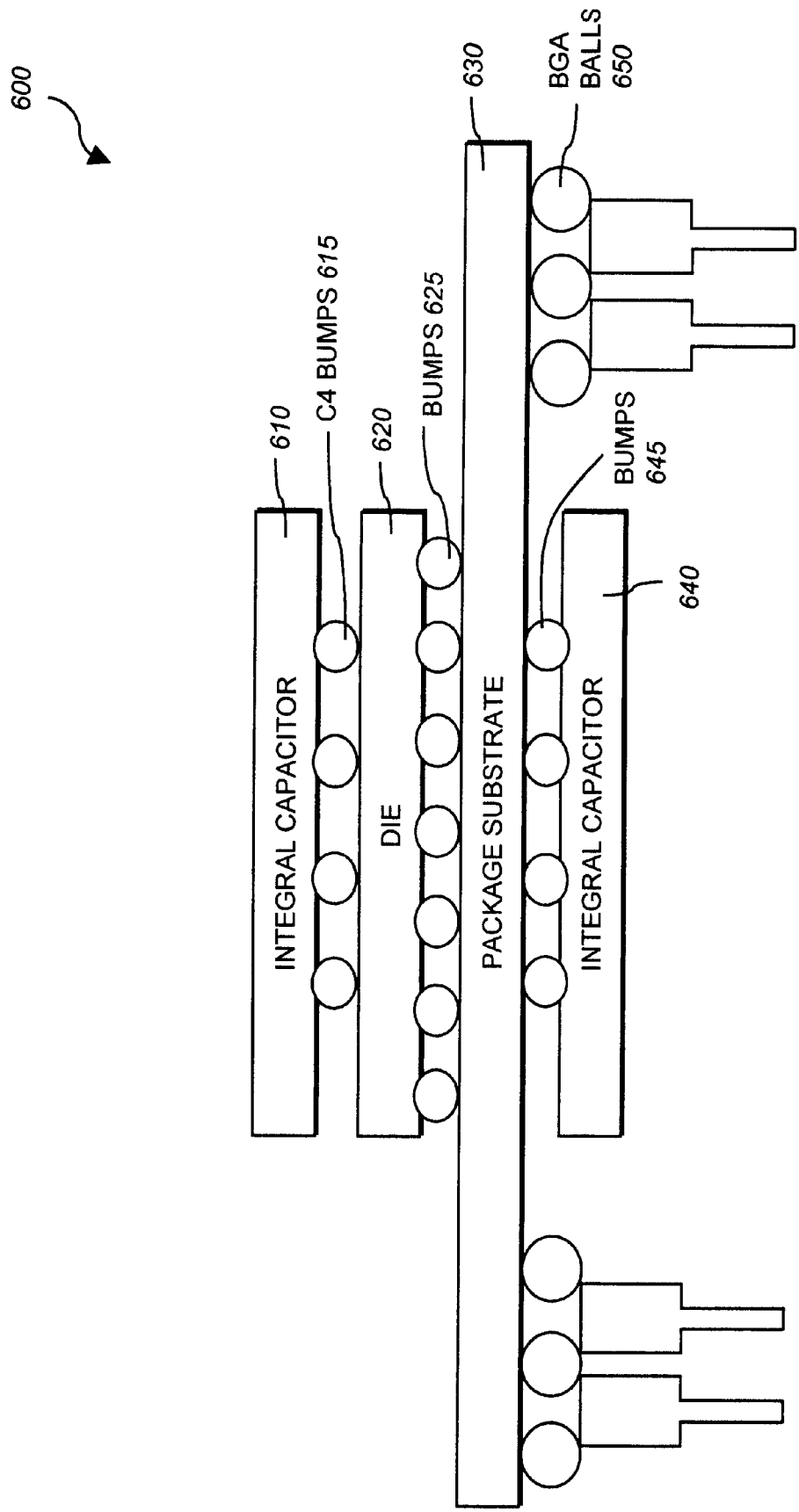
FIG. 6 is a diagram illustrating an integral capacitor with embedded enclosure according to one embodiment of the invention.

FIG. 6 is a diagram illustrating a packaged device 600 using an integral capacitor with embedded enclosure according to one embodiment of the invention. The packaged device 600 includes integral capacitors 610 and 640, a die 620, and a package substrate 630. The use of two integral capacitors 610 and 640 are for illustrative purposes only. In one embodiment, only one integral capacitor can be used. For example, the packaged device 600 may include either the integral capacitor 610 or the integral capacitor 640.

To reduce noise caused by high frequency signals and power fluctuations, there should be a number of bypassing capacitors. Using discrete capacitors in a typical circuit may occupy additional space and increase component and assembly costs. The integral capacitors 610 and 640 are integral to the packaged device 600 and therefore provide an effective means for noise reduction. In addition to providing capacitor bypassing, the integral capacitors 610 and 640 also provide electromagnetic radiation reduction. The integral capacitors 610 and 640 are essentially similar. The integral capacitor 610 is attached to the top surface of the die 620 by a number of C4 bumps 615 while the integral capacitor 640 is attached to the bottom surface of the package substrate 630 by a number of C4 bumps 645. Since the integral capacitors 610 and 640 are similar, a description of the integral capacitor 610 is sufficient.

The die 620 contains an integrated circuit operating at a fundamental frequency. The die 620 is essentially similar to the die 120 shown in FIG. 1. The die 620 has a number of C4 bumps 625 attached to metal conductive pads or C4 bump pads (not shown) on the top surface of the package substrate 630. The integral capacitors 610 and 640 provide charge storage for the integrated circuit of the die 620.

The package substrate 630 can be formed from a ceramic material or non-ceramic materials such as FR-4. The package substrate 630 is attached to pads on a printed circuit board (not shown) by a number of solder balls 650. The solder balls 650 may be the BGA balls.

The integral capacitors 610 and 640 are constructed using the embedded enclosure as described above. The integral capacitors 610 and 640 essentially form an embedded Faraday cage to reduce electromagnetic radiation. The integral capacitors 610 and 640 typically have dimensions, size and shape comparable with the die 620. In one embodiment, the dimensions are approximately 1.5 cm×1.5 cm. The capacitance value depends on the noise reduction requirements. Typical values range from 10 to 50 microfarads (F).

Figure 7:
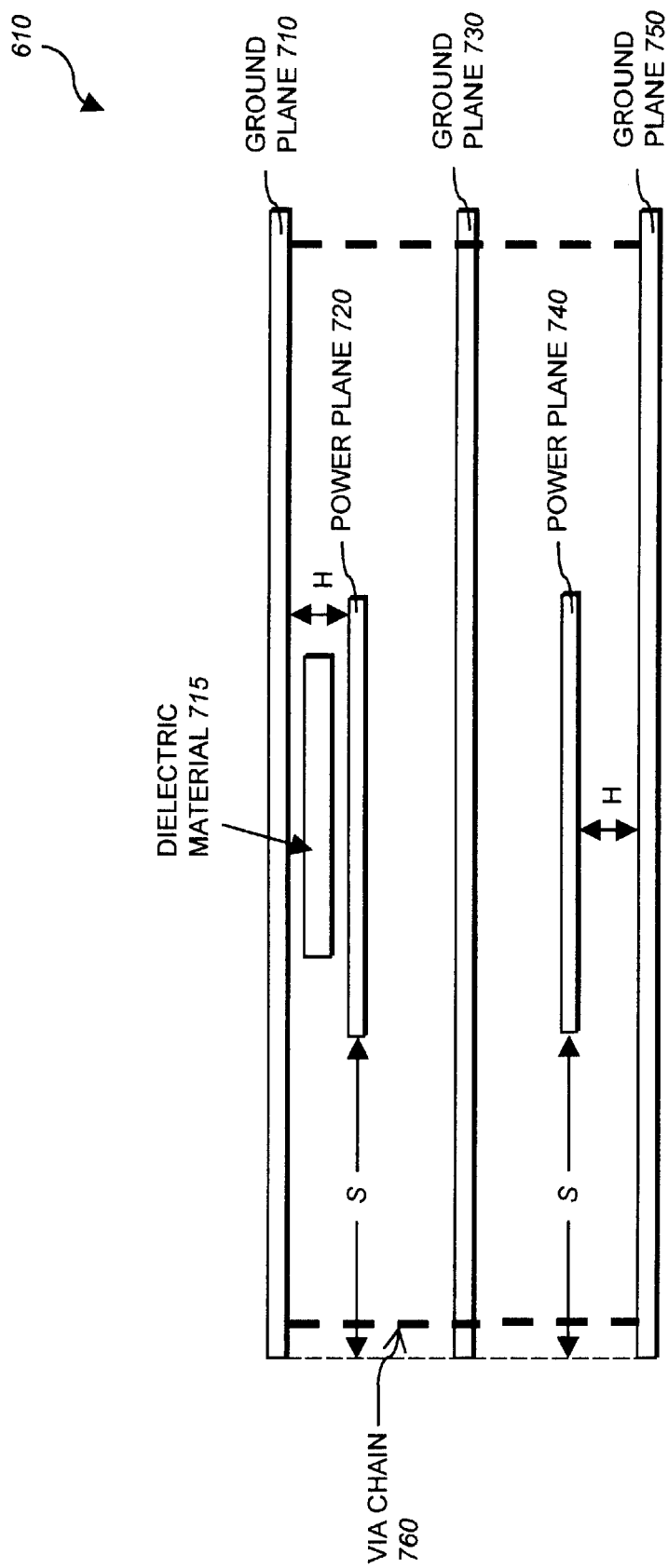
FIG. 7 is a diagram illustrating a cross sectional view of the integral capacitor according to one embodiment of the invention.

FIG. 7 is a diagram illustrating a cross sectional view of the integral capacitor 610 according to one embodiment of the invention. The integral capacitor 610 includes ground planes 710, 730, and 750, power planes 720 and 740, dielectric material 715, and via chain 760. The use of three ground planes 710, 730, and 750, and two power planes 720 and 740 are for illustrative purposes only. In alternative embodiments, the integral capacitor 610 may include any number of ground and power planes. For example, the integral capacitor 610 may include only the ground plane 710 and the power plane 720.

The ground planes and the power planes follow the distance relationship as discussed above. For illustrative purposes, only the distance relationship between the ground plane 710 and the power plane 720 is described. The distance relationship for the other ground and power planes is similar.

The dielectric layer 715 is formed between the ground plane 710 and the power plane 720. The material of the dielectric layer 715 may be any suitable material having high dielectric constant k, such as FR-4 or X7-R.

The ground plane 710 has a ground surface and a ground periphery. The power plane 720 has a power surface and a power periphery. The ground surface is larger than the power surface. Suppose the distance between the power periphery and the ground periphery is S and the distance between the ground surface and the power surface is H, then the distance relationship between S and H is S>20H. Like in the embedded enclosure, alternative embodiments may follow the relationship S>10H, S>5H, or S>1H.

The via chain 760 includes a number of adjacent vias which are electrically connected to the ground plane 710 and electrically isolated from the power plane 720. Similarly to the embedded enclosure shown in FIG. 3B, the adjacent vias are separated by a distance less than one quarter of the wavelength. The calculations of the wavelength follows the equations (1) through (3).

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An enclosure comprising:
   a power plane having a power surface and a power periphery, the power plane coupling power to signals of an integrated circuit operating at a fundamental frequency; and
   first and second ground planes having first and second ground surfaces and first and second ground peripheries, the first and second ground planes coupling ground to the signals, the first and second ground planes being separated from the power plane by first and second distances, respectively, the first and second ground surfaces being larger than the power surface, the first and second ground peripheries extending at least third and fourth distances from the power periphery, respectively, the third and fourth distances being N and M times larger than the first and second distances, respectively.

2. The enclosure of claim 1 wherein the first and second ground planes have first and second pluralities of vias located around the first and second ground peripheries, respectively, and outside the power periphery, the first and second pluralities of vias having adjacent vias, the adjacent vias being spaced apart by a via distance that is smaller than a quarter wavelength of the fundamental frequency, the first and second pluralities of vias being connected by a via chain.

3. The enclosure of claim 2 wherein the signals are on a signal plane located between the power plane and the second ground plane.

4. The enclosure of claim 1 wherein N is an integer ranging from 1 to 20.

5. The enclosure of claim 1 wherein M is an integer ranging from 1 to 20.

6. The enclosure of claim 1 wherein the first plurality of vias having electrical contact to a plurality of adjacent contacts, the adjacent contacts being spaced apart by a contact distance that is smaller than a quarter wavelength of the fundamental frequency.

7. The enclosure of claim 6 wherein the contacts are ones of controlled collapse chip connection (C4) bumps, ball grid array (BGA) balls, and flip chip pin grid array (FCPGA) pins.

8. The enclosure of claim 1 further comprises a contact array to connect to at least the first ground plane and the power plane.

9. The enclosure of claim 8 wherein the contact array is one of a C4 bump array, a BGA ball array, and a FCPGA pin array.

10. The enclosure of claim 9 wherein the ground plane has a plurality of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter wavelength of the fundamental frequency.

11. A packaged device comprising:
a die containing an integrated circuit having signals operating at a fundamental frequency;
a plurality of controlled collapse chip connection (C4) bumps attaching the die to a substrate; and
an enclosure attaching to the die to reduce radiation, the enclosure comprising:
a power plane having a power surface and a power periphery, the power plane coupling power to the signals of the integrated circuit, and
first and second ground planes having first and second ground surfaces and first and second ground peripheries, the first and second ground planes coupling ground to the signals, the first and second ground planes being separated from the power plane by first and second distances, respectively, the first and second ground surfaces being larger than the power surface, the first and second ground peripheries extending at least third and fourth distances from the power periphery, respectively, the third and fourth distances being N and M times larger than the first and second distances, respectively.

12. The packaged device of claim 11 wherein the first and second ground planes have first and second pluralities of vias located around the first and second ground peripheries, respectively, and outside the power periphery, the first and second pluralities of vias having adjacent vias, the adjacent vias being spaced apart by a via distance that is smaller than a quarter wavelength of the fundamental frequency, the first and second pluralities of vias being connected by a via chain.

13. The packaged device of claim 12 wherein the signals are on a signal plane located between the power plane and the second ground plane.

14. The packaged device of claim 11 wherein N is an integer ranging from 1 to 20.

15. The packaged device of claim 11 wherein M is an integer ranging from 1 to 20.

16. The packaged device of claim 11 wherein the first plurality of vias having electrical contact to a plurality of adjacent contacts, the adjacent contacts being spaced apart by a contact distance that is smaller than a quarter wavelength of the fundamental frequency.

17. The packaged device of claim 16 wherein the contacts are ones of controlled collapse chip connection (C4) bumps, ball grid array (BGA) balls, and flip chip pin grid array (FCPGA) pins.

18. The packaged device of claim 11 wherein the enclosure further comprises a contact array to connect to at least the first ground plane and the power plane.

19. The packaged device of claim 18 wherein the contact array is one of a C4 bump array, a BGA ball array, and a FCPGA pin array.

20. The packaged device of claim 19 wherein the ground plane has a plurality of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter wavelength of the fundamental frequency.

21. A method comprising:
coupling power to signals of an integrated circuit operating at a fundamental frequency by a power plane having a power surface and a power periphery; and
coupling ground to the signals by first and second ground planes having first and second ground surfaces and first and second ground peripheries, the first and second ground planes being separated from the power plane by first and second distances, respectively, the first and second ground surfaces being larger than the power surface, the first and second ground peripheries extending at least third and fourth distances from the power periphery, respectively, the third and fourth distances being N and M times larger than the first and second distances, respectively.

22. The method of claim 21 wherein the first and second ground planes have first and second pluralities of vias located around the first and second ground peripheries, respectively, and outside the power periphery, the first and second pluralities of vias having adjacent vias, the adjacent vias being spaced apart by a via distance that is smaller than a quarter wavelength of the fundamental frequency, the first and second pluralities of vias being connected by a via chain.

23. The method of claim 22 wherein the signals are on a signal plane located between the power plane and the second ground plane.

24. The method of claim 21 wherein N is an integer ranging from 1 to 20.

25. The method of claim 21 wherein M is an integer ranging from 1 to 20.

26. The method of claim 21 wherein the first plurality of vias having electrical contact to a plurality of adjacent contacts, the adjacent contacts being spaced apart by a contact distance that is smaller than a quarter wavelength of the fundamental frequency.

27. The method of claim 26 wherein the contacts are ones of controlled collapse chip connection (C4) bumps, ball grid array (BGA) balls, and flip chip pin grid array (FCPGA) pins.

28. The method of claim 21 further comprises connecting to at least the first ground plane and the power plane by a contact array.

29. The method of claim 28 wherein the contact array is one of a C4 bump array, a BGA ball array, and a FCPGA pin array.

30. The method of claim 29 wherein the ground plane has a plurality of adjacent contacts, the adjacent contacts being ones of controlled collapse chip connection (C4) bumps, ball grid array (BGA) balls, and flip chip pin grid array (FCPGA) pins and spaced apart by a contact distance that is smaller than a quarter wavelength of the fundamental frequency.

* * * * *